US012597756B2

(12) United States Patent
Segev et al.

(10) Patent No.: US 12,597,756 B2
(45) Date of Patent: Apr. 7, 2026

(54) TOPOLOGIC INSULATOR SURFACE EMITTING LASER SYSTEM

(71) Applicants: Technion Research and Development Foundation Ltd., Haifa (IL); Julius-Maximilians-Universität Würzburg, Würzburg (DE)

(72) Inventors: Mordechai Segev, Haifa (IL); Sven Höfling, Karlstadt (DE); Sebastian Klembt, Gerbrunn (DE); Alexander Dikopoltsev, Haifa (IL); Tristan Harder, Wurzburg (DE); Eran Lustig, Haifa (IL); Yaakov Lumer, Haifa (IL)

(73) Assignees: Technion Research and Development Foundation Ltd., Haifa (IL); Julius-Maximilians-Universität Würzburg, Würzburg (DE)

( * ) Notice: Subject to any disclaimer, the term of this patent is extended or adjusted under 35 U.S.C. 154(b) by 737 days.

(21) Appl. No.: 17/997,064

(22) PCT Filed: Apr. 27, 2021

(86) PCT No.: PCT/IL2021/050489
§ 371 (c)(1),
(2) Date: Oct. 25, 2022

(87) PCT Pub. No.: WO2021/220276
PCT Pub. Date: Nov. 4, 2021

(65) Prior Publication Data
US 2023/0223735 A1     Jul. 13, 2023

Related U.S. Application Data

(60) Provisional application No. 63/015,888, filed on Apr. 27, 2020.

(51) Int. Cl.
*H01S 5/42* (2006.01)
*H01S 5/00* (2006.01)

(52) U.S. Cl.
CPC ............ *H01S 5/0014* (2013.01); *H01S 5/423* (2013.01); *H01S 2301/20* (2013.01)

(58) Field of Classification Search
CPC .... H01S 5/0014; H01S 5/423; H01S 2301/20; H01S 5/18; H01S 5/1021; H01S 5/11;
(Continued)

(56) References Cited

U.S. PATENT DOCUMENTS

| | | |
|---|---|---|
| 2010/0046571 A1 | 2/2010 | Hori |
| 2014/0301418 A1 | 10/2014 | Kim et al. |

(Continued)

FOREIGN PATENT DOCUMENTS

| | | |
|---|---|---|
| CN | 110727047 A | 1/2020 |
| CN | 110932091 A | 3/2020 |

(Continued)

OTHER PUBLICATIONS

Machine translation of JP2019029522A (Year: 2019).*

(Continued)

*Primary Examiner* — Yuanda Zhang
(74) *Attorney, Agent, or Firm* — FisherBroyles, LLP; Roger L. Browdy; James E. Mrose

(57) ABSTRACT

A laser source is presented a plurality of unit cells of a selected number of partially physically coupled lasing units arranged within a plane and configured to form a topological structure, wherein each of the lasing units is configured to emit radiation component substantially perpendicular to said plane, said plurality of the unit cells comprising at least a first sub-array of the unit cells located in a first region interfacing with a second region of a different type than said first region, thereby defining an arrangement of optically
(Continued)

coupled lasing units along an interface region between the first and second adjacent regions, forming at least one topological state along a topological path within said interface region.

20 Claims, 10 Drawing Sheets

(58) Field of Classification Search
CPC .......... H01S 5/005; H01S 5/1042; H01S 5/42;
H01S 2301/163
See application file for complete search history.

(56) References Cited

U.S. PATENT DOCUMENTS

| | | | |
|---|---|---|---|
| 2020/0119524 A1 | 4/2020 | Segev et al. | |
| 2022/0352691 A1* | 11/2022 | Ma | .......................... H01S 5/042 |

FOREIGN PATENT DOCUMENTS

| | | | |
|---|---|---|---|
| JP | H5-508971 | A | 9/1993 |
| JP | 6-252504 | A | 9/1994 |
| JP | 2008311625 | A | 12/2008 |
| JP | 2019029522 | A | 2/2019 |
| WO | 9210867 | A1 | 6/1992 |
| WO | 18185749 | A1 | 10/2018 |
| WO | 20198321 | A1 | 10/2020 |

OTHER PUBLICATIONS

Dikopoltsev, et al., Topological insulator VCSEL array, 2020 Conference on Lasers and Electro-Optics (CLEO), Osa, May 10, 2020, pp. 1-2.

* cited by examiner

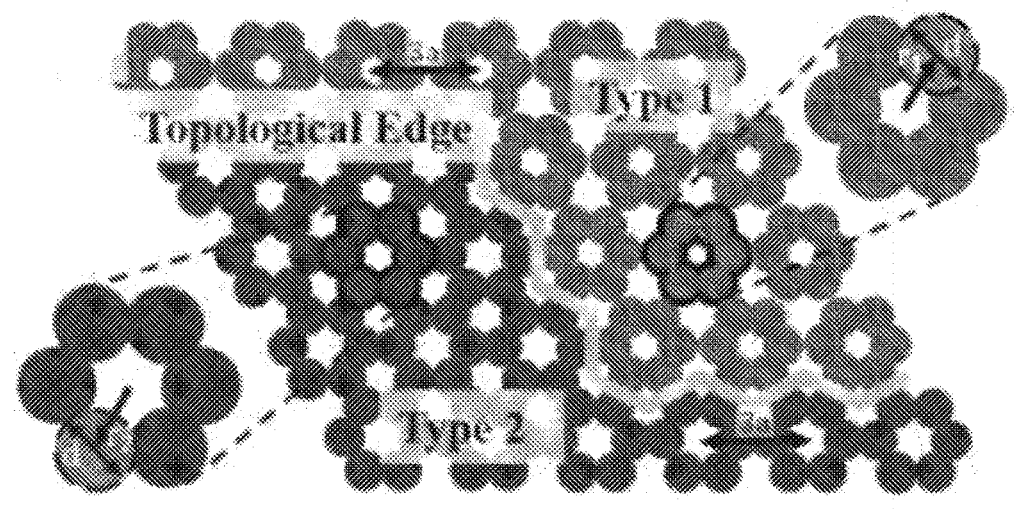
FIG. 4A
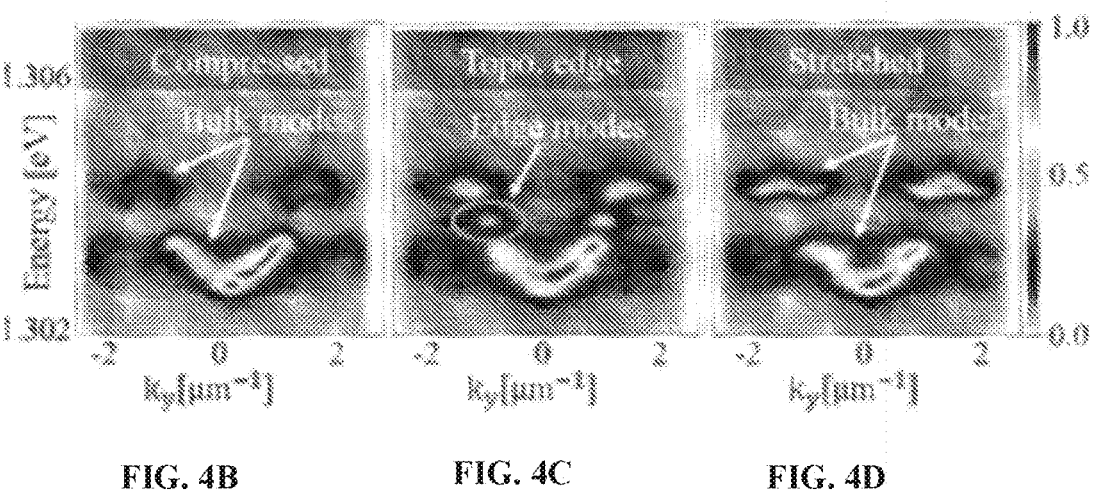
FIG. 4B                    FIG. 4C                    FIG. 4D

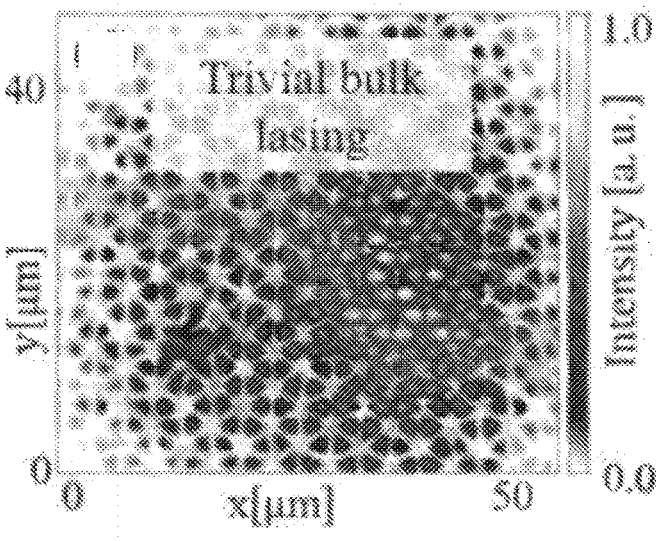
FIG. 5D
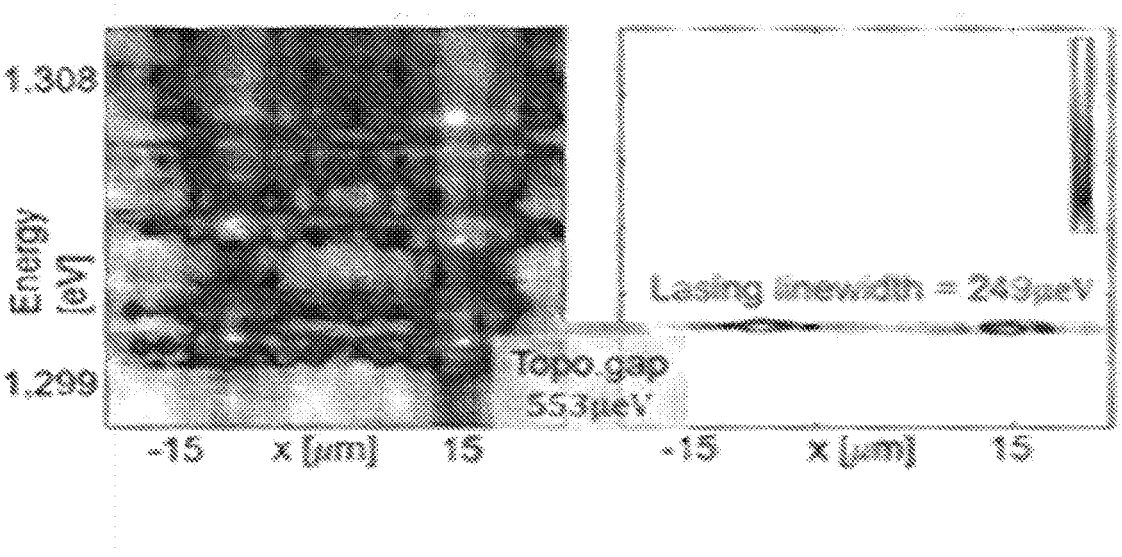
FIG. 6A                              FIG. 6B

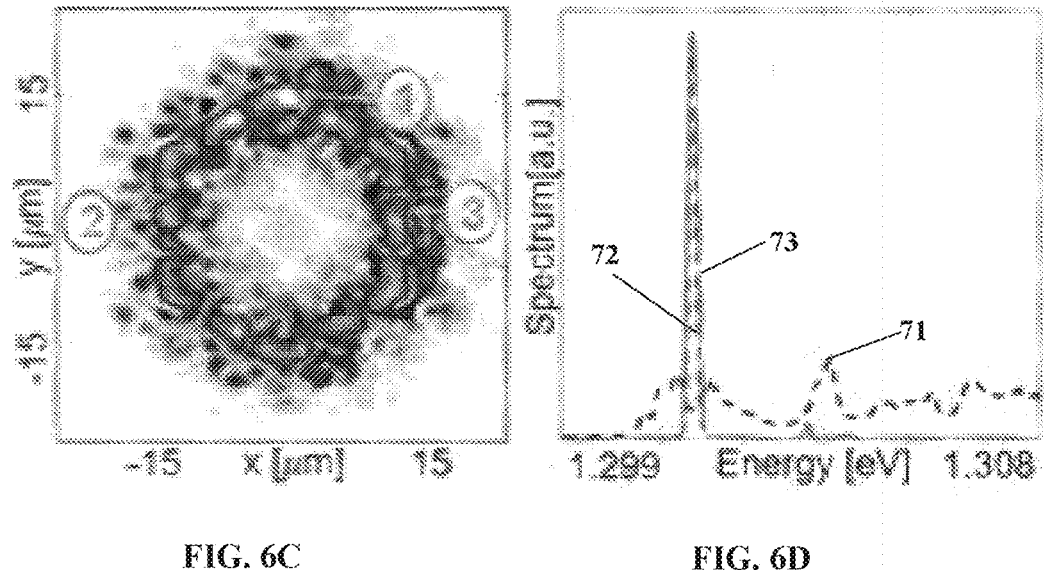
FIG. 6C                              FIG. 6D

TOPOLOGIC INSULATOR SURFACE EMITTING LASER SYSTEM

TECHNOLOGICAL FIELD

The present invention is in the field of laser systems and is relevant to laser systems including arrays of gain element providing surface emission. The invention relates in particular to laser systems utilizing photonic topological states for selected lasing modes.

BACKGROUND

Diode lasers (also known as semiconductor lasers) are the most commonly used lasers system, with applications ranging from optical telecommunications to compact disks and much more. The gain in semiconductor lasers is high (in terms of gain per unit length), but the power emitted from a single semiconductor laser is limited, and generally does not exceed a few Watts. Extensive research is and has been carried out to develop arrays of semiconductor lasers, where neighboring emitters are coupled to one another, with the goal to overcome the power limitation of a single element and the critical damage limitations, while maintaining a narrow spectrum and a stable emission field that is robust against variations in pumping power, fabrication defects and disorder. In principle, laser array structures can provide high laser power. However, such laser array structures tend to provide emission with many spatial (longitudinal) and spectral (transverse) modes simultaneously, where the modal structure of the laser array system (near field and spectrum) vary with the pumping strength, thereby greatly reducing the coherence properties of the laser and the stability to variations in the pumping and environmental conditions. Likewise, when the number of laser elements is increased, the coherence between emitters is greatly reduced. Despite many methods suggested to control the emission pattern of laser diode arrays, current technology is still not able to produce laser array systems operating as a single high-power coherent laser source. Consequently, the most common application of laser array systems is as pump modules (instead of flashtubes) for solid state lasers.

Topological insulators are phases of matter characterized by topological states (typically edge states) having spatial configuration/path that is stable and robust to local variations. In the past decade, the principles of topological insulators have been demonstrated in various physical systems, ranging from photonics and microwaves to acoustics, mechanics and cold atoms. Specifically, with electromagnetic waves, topological insulators have been demonstrated in systems of coupled elements, such as waveguides or resonators. In general, the scientific understanding considers that to support topological states within a system, the system needs to be such that it can be represented as Hermitian system, i.e. a passive system that contains no gain. Adding gain to topological insulators (in all systems) makes the system non-Hermitian and nonlinear (due to the nature of gain media), which was believed to break the topological properties, specifically to break the topological protection of transport in the system, rendering the system susceptible to defects and imperfections.

Vertical-cavity surface-emitting lasers, or VCSEL's, are semiconductor laser diodes configured to provide perpendicular laser beam emission. Such VCSEL laser units are typically formed by selected arrangement of layers forming gain layer between reflecting layers and configured to emit laser light from the top or bottom surface of the VCSEL.

WO 2018/185,749 describes a topological laser system. The laser system comprises an array of optical elements arranged in an array and coupled between them such that the array is configured for supporting one or more topological modes. The plurality of optical elements comprises optical elements carrying gain material configured for emitting optical radiation in response to pumping energy. The laser system further comprises a pumping unit configured to provide pumping of a group of the optical elements of the array within at least a portion of the spatial region corresponding with said topological mode; and at least one output port optically coupled to one or more of the optical elements associated with said topological mode. At least one output port is configured for extracting a portion of light intensity from said laser system.

GENERAL DESCRIPTION

There is generally a need for high power semiconductor lasers that can be constructed as compact-size devices emitting/generating high-power/intensity coherent laser beams. The currently existing conventional high-power laser system are mainly bulky and complex, while compact high-power laser systems are still needed. Laser array systems are often used for generating high intensity laser emission. Typically, the combined emission from laser arrays may have low coherence and be subjected to variations due to disorder, manufacturing defects and changes in the environment. The use of topologic coupling between laser units enables robust coupling that is stable to various defects and provides high coherence collective emission. The currently known topological coupling configurations provide light emission directed within a plane of coupling. In such configuration, high intensity emission may cause nonlinear interaction of the light field passing through the optical in-plane waveguide of the laser units and/or through the output coupler fiber. Moreover, to sustain such high intensities, the gain must be increased, which for electrical pumping might cause irreversible damage to the waveguide and the laser units.

Generally, the maximum output power of a single lasing unit may generally be limited by physical constrains and can potentially reach only a few Watts. One problem with constructing an array of lasing units is that lasing units in the array lase/emit independently, and therefore the collective emission might not result in a coherent beam, or even not at the same central frequency. To overcome lasing at different frequencies, it is possible to couple the lasing units in the array between themselves in a uniform scheme and expect them to lase at a single mode for all emitters. However, as the array size grows, mainly due to disorder and defects, this always results in incoherent lasing of many localized modes. Thus, such an incoherent array behaves as a strong "flashlight" and not a single powerful coherent beam. Consequently, such incoherent light cannot be coupled efficiently into optical media such as a single-mode fiber, and would not be useful for applications requiring coherent beam(s).

The present technique utilizes topological coupling between laser units to increase emission coherence and stability, and therefore intensity, while overcoming issues associated with nonlinear interactions of high intensity emission passing through optical in-plane waveguides. To this end, the present technique creates, in a plurality of light emitting units (lasing units), a topological array/topological edge of the light emitting units due to proper coupling between them. More specifically, the plurality of the light emitting units defines a light emitting surface (emitting plane) and the light emitting units are configured to emit electromagnetic radiation components in a direction substantially perpendicular to the light emitting surface (in response to pumping energy). In the description below, such emission in a direction substantially perpendicular to the light emitting surface is referred to as "vertical emission".

Such vertical emission provides the proper coupling between the lasing units at an interface of said array with a different media. The different media may be constituted by a free space (e.g. air), or by another adjacent array of lasing units of a different type (e.g. having different configuration).

Neighboring lasing units in said plurality of the vertically emitting lasing units are physically coupled between them, providing formation of a topological edge of the adjacent lasing units along an interface (topological path) with a different-type media, e.g. at the interface between at least two sub-arrays of the lasing units of at least two different types arranged in at least two respective adjacent regions.

The topological edge of the lasing units is characterized by a topological state (edge state) providing the optical coupling between the lasing units of said array such that collective emission of the adjacent lasing units along the interface region builds up coherently, forming a single/uniform coherent beam directed substantially perpendicular to the light emitting surface, without a need for any output coupler.

Coupling many optical resonators together (array of resonators) induces super modes of the entire array, i.e., the resonators no longer possess individual properties and modes, but belong to a larger system with super-modes that each includes more than one laser. In a periodic structure, these form a band diagram which is the spectrum as a function of the wavenumber. These band diagrams are divided into bands and gaps. A band is a range of frequencies that belong to extended modes of the system. These modes, due to their extent, are able to transfer energy across the array. In the case of frequencies that lie in the gaps, energy transfer along the bulk of the array is impossible, i.e., in these frequency ranges the array acts as an insulator.

The photonic couplings between the resonators can be controlled to form topologically non-trivial frequency gaps with topological edge modes. These edge modes exist only on the edges of the array (or the interface between two different arrays) and cannot transfer energy through the array bulk. However, they have two unique properties: they always extend over the whole edge/interface of the array, even if the array contains disorder, including sharp corners (defects); and the group velocity of these modes is non-zero, meaning that energy can be transferred along the edge. These properties combined allow for robust energy transfer along the edge/interface through these modes.

A 2D topological laser array includes a topological resonator array arranged in a topological coupling scheme to form topological modes, with pumping of the edge/interface of these modes. The topological laser array inherits the resonator array properties, and therefore the energy transfer between the lasers on the edge becomes immune to disorder and defects, preserving the coherence between lasers over the whole edge/interface. Otherwise, disorder in the array might lead to localized modes, and therefore lasing in localized groups of lasers (this directly would lead to a wider spectrum and loss of coherence between lasers in different localized groups).

The present invention utilizes a novel configuration of a topological structure of the laser array, in which each lasing unit (resonator) of the topological laser array confines the light vertically and therefore emits the light vertically to the 2D array plane, but also enables light to be emitted out of plane, while the in-plane coupling between the selected lasing units (at the interface/edge) induces the topological protection in the 2D array plane.

Generally, the topological structure may be configured using any known suitable topological Hermitian model such as crystalline, strong coupling, magnetic field based, Hafezi, Floquet topological insulators, bi-anisotropic, etc. According to the invention, however, any of the suitable model is implemented using vertically emitting lasing units.

In some preferred embodiments, the invention utilizes the crystalline model which has two interfacing sub-arrays of different configurations.

Preferably, the plurality of lasing units are arranged in the form of a plurality of unit cells, each including a selected number of physically coupled lasing units.

The unit cell can include at least two different vertically emitting lasing units having at least two bands in the band structure, separated by a bandgap. The array is designed such that an additional degree of freedom (typically phase) induces a topological distinction between the two separate bands, i.e. creates a fundamental difference between the modes in the two separate bands, such that modes in one of the bands do not couple to modes in other bands. There might be a vortex in the phases of the modes in a band. The two bands can be classified to two topologically distinct objects that cannot be continuously deformed to one another under certain symmetry requirements. For the lasing array, an interface between the lasing units and a different media (e.g. air) without this topological difference between the band modes, closes the gap, but only at the interface (topological path). This leads to edge modes that cross from one band to the other.

In the embodiment of two or more adjacent (interfacing) sub-arrays of different types, the lasing units of the same unit cell may be identical or not, but the unit cells of the different sub-arrays are configured differently defining the adjacent different unit cells extending along the interface region (topological path).

The unit cells of the array(s) may be arranged with a certain periodicity (period sub-array).

The light emitting units can be configured as vertical cavity units, e.g., based on Vertical-Cavity Surface-Emitting Lasers (VCSEL) technology. In the description below, the light emitting units are at times referred to as VCSELs, but it should be understood that the principles of the present invention are not limited to this specific configuration although it might be preferable. Therefore, the principles of the technique of the present invention should be interpreted broadly as described above.

The lasing units (VCSEL units) are arranged to provide coupling between them within the emitting plane. In this configuration, most of the energy is emitted outside the emitting plane by the VCSEL units, however some amount/portion of the energy flows in-plane thereby providing optical coupling between the VCSEL units. The VCSEL units within the interface region exchange this coupling energy to lock them together and generate a stable light source. This is in contrary to the in-plane topological configurations described above where most of the electromagnetic energy flows forward between the laser units and waveguides and builds up until it reaches the output port/coupler, which, when exposed to high-power radiation, can be damaged.

Thus, the use of VCSEL units provides light emission directed outside of the plane where the optical coupling between them occurs (the coupling that locks the VCSEL units) and therefore the emitted illumination needs not interact with optical fibers or any material that may give rise to undesired nonlinear behavior/effects. Each VCSEL unit (lasing unit) of the array emits light of specified allowed intensity, and the collective intensity is directed outward the VCSEL units, without worsening the reliability of the array.

Generally, VCSEL units are relatively cheap, easy to fabricate and most importantly directly provide vertical light emission (assuming horizontal emitting plane), i.e., emission substantially perpendicular to the plane defined by the arrangement of the array. Such VCSEL units are formed by a layer structure comprising gain medium located between top and bottom reflecting layers. The gain medium may be formed by a quantum well or quantum dots layer. The layer structure of the VCSEL is positioned/grown on a substrate, typically in the form of a pillar growing from, or etched from a substrate. The layer configuration of the VCSEL units provide optical emission in a direction perpendicular to the plane defined by the layers, thereby providing surface emission of the VCSEL.

The present technique utilizes a plurality of VCSEL units (preferably arranged in a plurality of unit cells) arranged such that all neighboring lasing units are physically coupled between them (e.g. via surface touch or through partial physical overlap of surface regions of neighboring VCSEL units).

These VCSEL units (unit cells) may include two interfacing groups/sub-arrays of the VCSELs having two different configurations, which are arranged in two adjacent regions defining the interface region of the topological array of the adjacent VCSELs (unit cells) of the different types/configurations. This provides proper optical coupling between the VCSELs (unit cells) in the topological array resulting in collective highly-coherent emission from the adjacent different VCSELs along said interface, and induces topological properties of the entire system (entire array) such that coherence of the emission is maintained. Such topological properties (one or more topological states) of the adjacent VCSELs along the interface region are the result of the different geometries and/or coupling properties of the sub-arrays, e.g., different sizes of unit cells of VCSELs in the sub-arrays.

As described above, in some cases, a single array with specific coupling properties suffices to create a topological edge state for coherent lasing.

The VCSEL units are typically positioned on (grown on or etched from) a substrate. The plurality of VCSEL units may be viewed as a plurality of pillars stretching from the surface of the substrate. To provide coupling between them, the VCSEL units are configured to touch neighboring VCSEL units or form partial overlap along a portion of the unit surface (e.g., circumference thereof). Typically, the gain layer of the VCSEL units, and possibly the top and bottom reflecting layers touch those of neighboring VCSEL units. This generates coupling of light between the VCSEL units. The coupling between the VCSEL units determines the collective modes (super-modes) in the array. The emission pattern of the laser array would be determined by the collective modes of the array.

Generally, the array of VCSEL units has selected geometry that supports one or more topological states/edge states. More specifically, the partial overlap between VCSEL's of the array generated optical coupling, i.e., coupling between modes of optical field. This forms spatial optical modes stretching between plurality of VCSEL's in the array. Geometry of the array is selected to support one or more topological states, that are separated from other modes of the array. Thus, spatial arrangement and coupling parameters provide one or more topologically stable states having a certain spatial path.

As indicated above, lasing units (e.g. VCSEL units) may be arranged to form a plurality of unit cells, each unit cell including a number of the neighboring lasing units. Preferably, the arrangement of unit cells defines a crystalline type lattice. Optical coupling between the adjacent unit cells of the array at the interface with a different media, e.g. between the adjacent sub-arrays of two different types in the interface region (topological path) gives rise to crystal-like behavior supporting optical modes and defining certain band structure (as in photonic crystals). Given the spatial arrangement and properties of the lasing units (unit cells), the band structure of the system and the wavefunctions of the various photonic states are determined and can be calculated using various known techniques.

In some configurations, the array of VCSEL units according to the present technique is formed of two or more types of unit cells, where each unit cell is formed by an arrangement of selected number of VCSEL units. The two or more types of unit cells differ one from another in at least one of the geometrical arrangements and/or optical coupling of the lasing units forming the unit cell.

In some embodiments, a first region of the VCSELs array formed by the VCSEL units of the first type (unit cells of the first type) are substantially surrounded by a second region formed by the VCSEL units of the second type (unit cells of a second type).

The first and second adjacent interfacing regions, including the lasing units (unit cells) of the first and second types, can be characterized by a respective crystalline geometry/arrangement of the lasing units/unit cells. The topological properties of the system are attained due to different geometries/arrangements of the lasing units on opposite sides of the interface between different parts/regions of the array. More specifically, such an arrangement of the lasing units enables removal of corresponding Dirac points within the band structure thereby generating/opening corresponding band gaps with different topological invariants for each region. The geometry/arrangement of the first and second regions provides that the respective band gaps are aligned with each other (having a substantially the same band gap) forming a single/uniform topological gap along the interface between the regions. This allows for collective coherent emission/lasing of lasing units in one or more paths along the interface at an operating wavelength of the topological gap. Accordingly, this configuration may generally support one or more topological edge-states extending along the interface between the first and second regions of the array, e.g. along a closed path of the interface. These topological edge states provide topologically-protected transport of light between the lasing units, namely, the light is substantially not scattered and is substantially not reflected due to possible defects, disorder and/or fabrication imperfections in the structure of the array. The topologically-protected transport occurs in the plane of the array and enables locking (optically coupling) adjacent lasing units together, thereby causing all of the lasing units within the interface region to lase together (collective emission) as a single coherent high-power source.

The laser system described herein can be associated with either optical and/or electrical pumping. In the case of electrical pumping, in some embodiments, the part of the contact that is on top of the VCSEL is a transparent conductor. Such transparent conductor/contacts do not change the properties of the collective lasing as they only affect the electronic properties of the system. Thus, when providing pumping energy generally directed along the one or more topological paths (interface regions), or part thereof, the VCSEL units along the path of the topological state region emit light while maintaining temporal and spatial coherence along the topological path. In some cases, the optical emission may have a certain phase profile along the path of the topological state. Such phase profile is typically associated with phase variations between the VCSEL units along the topological path region and is specific to each topological state. In such configurations, a phase mask of selected patterns may be used to correct the phase profile and provide the optical emission with desired phase profile, and preferably flat phase profile.

Since the coherent light is emitted from individual VCSELs, and light can be collected to a single beam so as to provide the effect of high intensity beam, the laser system can be used with a lens arrangement (e.g., a micro lens array) that can control the phase and the waist of the beam of each VCSEL unit.

The laser source system described herein can be fabricated based on standard pillar VCSEL configuration. More specifically, providing a substrate carrying layer structure formed by a bottom reflector layer, quantum well or quantum dots gain layer and top reflector layer. Etching a plurality of partially overlapping pillar in the layer structure in accordance with the selected geometry. The geometry is selected to support one or more topological states along the array. Providing a pumping arrangement (e.g. pumping electrodes) for pumping the VCSEL units along one or more selected topological states to cause the VCSEL units to emit light. The coupling between the VCSEL units causes collective emission in accordance with parameters of the topological state. In some other embodiments, the array of VCSEL units may be grown on a substrate layer by layer, e.g. by one or more deposition methods.

Further, the VCSEL array includes selected gain material enabling emission of light of one or more selected wavelength ranges in response to pumping energy. Light intensity occupying the one or more topological states of the array cause stimulated emission into the topological states. Due to the geometry of the system, often, only modes in the topological band have edge states between region types with different unit cells, and have maximum overlap with the pumping of the edge. Therefore, the lasing modes are spectrally located at the lowest bandgap of system. The VCSEL's emit light vertically, and the coupling to the lasing modes occurs through the top or bottom of the array. In some embodiments, a phase mask is added to combine the output into a single stable and coherent beam.

The topological state of the topological insulator lasing system as described herein, is typically an edge state characterized by light field propagating in clockwise and/or counterclockwise directions along the peripheral edges of the array. Generally, such topological states have certain width corresponding to radiation intensity of the lasing units at the interface region, e.g. lasing units in the sub-arrays existing on both sides of the interface region. Accordingly, the interface region associated with the topological state may have certain width (herein referred to as width of the topological state), corresponding to evanescent decay of light intensity of the topological state into the bulk of the array. Such width may be within the range of a few lasing units. In some configurations, the selected region for pumping corresponds with the width of the topological states.

The topological insulator laser system of the present invention provides a high-power coherent light source that can have such small dimensions that it can be integrated in any type of system/device, piece of matter, fabric and/or even organic/live tissues. Thus, the topological insulator laser system of the present invention can have various applications in different industries.

The laser source system of the present invention can be utilized for higher signal integrity in signal transmission in fibers, but also for free space communication, as in long-distance high-speed fibreless communication, e.g., with satellites. A topological VCSEL array could replace light sources in this industry to have higher output powers on a chip. Further, laser system of the present invention, which is operable as a high-power light source, can be also used for pumping, plastic welding, soldering and the like. Moreover, the automotive industry is putting a strong emphasis on radars, which require high power sources, much more powerful than a single semiconductor laser. A coherent array is the optimal solution in terms of price, power and compactness.

In medical applications, the main use of lasers is to treat or remove tissues. Such devices require more than several mW lasers to change the structure of the tissue. The laser system of the present invention, being a cheap semiconductor high power laser, could be the optimal solution for this industry. It could be used in non-invasive surgery, for example a pill that laser cuts from the inside. Also, the array can be used for a precise tissue slicing by steering the cutting beam with the phased array technique. This invention could be used for cosmetic treatments as well.

Thus, according to one broad aspect of the invention, it provides a laser source comprising a plurality of unit cells of a selected number of partially physically coupled lasing units arranged within a plane and configured to form a topological structure, wherein each of the lasing units is configured to emit radiation component substantially perpendicular to said plane, said plurality of the unit cells comprising at least a first sub-array of the unit cells located in a first region interfacing with a second region of a different type than said first region, thereby defining an arrangement of optically coupled lasing units along an interface region between the first and second adjacent regions, forming at least one topological state along a topological path within said interface.

In some embodiments, the said interface region is exposed to air in said second region (e.g. air environment outside the laser source).

The lasing units of the unit cells may include at least two different lasing units.

In some embodiments, said plurality of the unit cells comprises at least one second sub-array of the unit cells located in said second region, the first and second sub-arrays having unit cells of respective first and second different configurations, and being arranged in first and second adjacent regions defining the arrangement of the adjacent lasing units along the interface between the first and second regions, forming the at least one topological state along the topological path within said interface.

According to some embodiments, the laser source further comprises a pumping unit configured to provide pumping energy to a selected region of the array, wherein said selected region at least partially coincide with said closed path defined by one or more topological states. According to some embodiments, the array/sub-arrays of the unit cells may be configured as periodic array(s) such that the unit cells of the array/sub-arrays are formed by a selected number of the lasing units, where the first and in some cases the second types of unit cells are formed with first and second different levels of physical coupling (e.g. overlap) between the lasing units of the unit cell.

The laser source of the present invention is configured to emit light in a direction extending out of said plane defined by the array of VCSEL units. According to some embodiments, the VCSEL units associated with the one or more topological states emit light vertically relative to an amplitude of mode at the specific VCSEL location, thereby VCSEL units associated with said one or more topological modes contribute to form an output beam.

Preferably, the lasing units are configured as VCSELs.

According to some embodiments, the VCSEL units associated with said one or more topological states emit light vertically to the surface where the coupling between the VCSEL units occurs, thereby VCSEL units associated with said one or more topological modes contribute to form a single output beam. According to some embodiments, the plurality of VCSEL's may be formed as pillars extending from a surface of a substrate and at least partially overlapping between them.

According to some embodiments, the lasing units (e.g. VCSELs) of the unit cell are arranged in a honeycomb configuration.

Generally, the unit cells may be of a certain geometric shape (e.g., hexagon), and the first and second types of said unit cells having relatively oversized (stretched) and undersized (compressed) configuration of said geometric shape.

According to some embodiments, the lasing units are configured as quantum well or quantum dot gain layer based structures.

According to some embodiments, the plurality of the lasing units are arranged in a triangular lattice, and preferably arranged in the unit cells comprised of six lasing units each.

According to some embodiments, the laser source may further comprise a phase mask positioned at output path of light emitted from the lasing units of the topological array, said phase mask having phase pattern selected to provide a single coherent high intensity output beam.

The laser source may be associated with a "vertical" light collector, coupled to at least one, more often all, of the lasing units in the topological path, configured for extraction a portion of light intensity from said laser source.

According to some embodiments, said vertical light collector comprises a phase mask to correct the output into a desired output phase. The vertical light collector comprising a phase mask to correct the output into a desired output phase may include an optical waveguide to collect the light and direct to a desired location and/or direction.

According to some embodiments, gain media of the lasing units includes at least one of two III-V group semiconducting materials. The gain layer may comprise at least one of the following: Gallium compound, Arsenide compound, Indium compound. Considering the VCSEL configuration of the lasing unit, Bragg mirrors may include at least one of Gallium and Arsenide compounds.

According to another broad aspect of the invention, there is provided a laser source comprising a plurality of lasing units arranged within a plane and configured to form a topological structure, wherein each of the lasing units is configured to emit radiation component substantially perpendicular to said plane, the lasing units being arranged in a plurality of unit cells, each including a selected number of physically coupled lasing units, said plurality of the unit cells comprising at least two sub-arrays of the lasing units of at least two different configurations, respectively, located in at least two adjacent regions, thereby defining an arrangement of adjacent lasing units along an interface region between said at least two adjacent regions, forming at least one topological state along a topological path within said interface region.

BRIEF DESCRIPTION OF THE DRAWINGS

In order to better understand the subject matter that is disclosed herein and to exemplify how it may be carried out in practice, embodiments will now be described, by way of non-limiting examples only, with reference to the accompanying drawings, in which:

FIGS. 4A to 4D exemplify laser source array geometry (FIG. 4A), and variation in array lasing modes between bulk modes of the at least one type (in this case two types) (FIGS. 4B and 4D) and topological edge in between (FIG. 4C); and FIGS. 5A to 5D exemplify laser emission of the array illustrated in FIG. 4A, FIG. 5A shows spatial pattern of emission, FIG. 5B shows emission spectrum of topological mode, FIG. 5C shows luminescence of the optical modes below the lasing threshold, and FIG. 5D shows the spatial emission pattern of modes, again, in the case when the pump does not reach the lasing threshold;

FIGS. 6A to 6D exemplify measurements of the lasing pattern and the spectrum which illustrate spectrum as a function of position at the topological interface, where FIG. 6A shows spectrum of the excited photonic states when pumping is below the lasing threshold, FIG. 6B shows lasing spectrum of the topological state under optical pumping above the lasing threshold, FIG. 6C shows the optical output of the system, and FIG. 6D shows the total lasing spectrum of the topological array;

DETAILED DESCRIPTION OF EMBODIMENTS

Figure 1A:
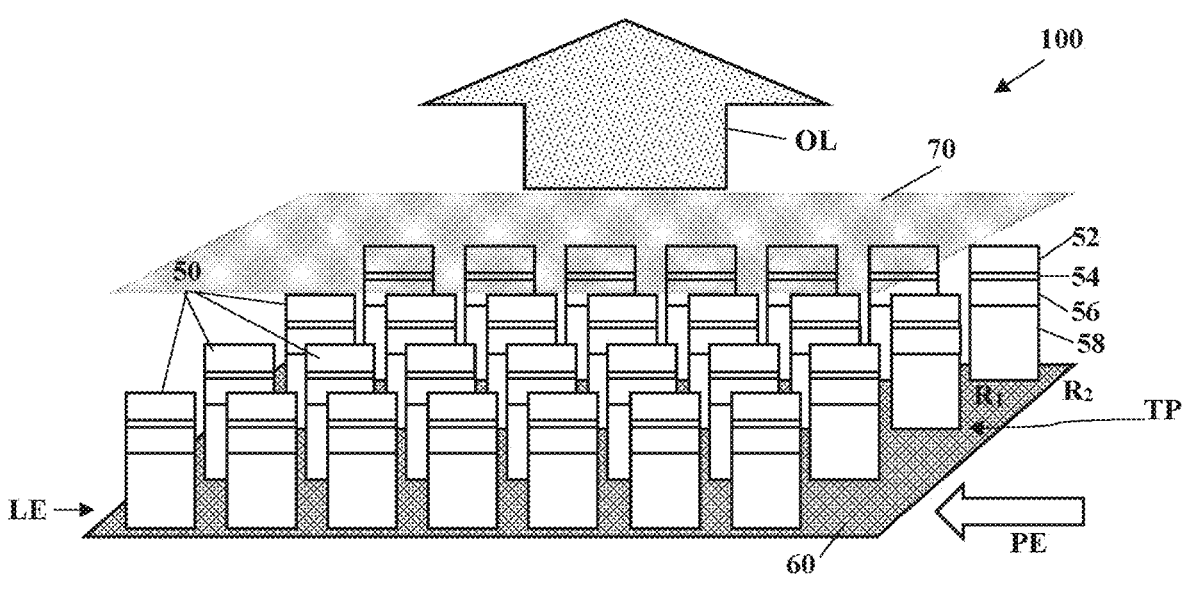
FIG. 1A schematically illustrates the configuration and operation of a laser source according to some embodiments of the present invention utilizing a plurality of vertically emitting lasing units (e.g. VCSELs) configured to define a topological state at the interface region between at least a selected sub-array of the lasing units and a different type media.

As indicated above, the present technique provides a laser source, and systems utilizing such laser source formed by an array of coupled laser units, where the array is configured to support one or more topological states. Such configuration of the array enables pumping of laser units associated with the one or more topological states, generating collective optical emission associated with the selected topological state. This configuration provides stable emission and is robust to noise and manufacturing defects.

The laser source of the present technique utilizes lasing units arranged in a plane and producing lasing components in a direction substantially perpendicular to said plane, e.g. or Vertical-Cavity Surface-Emitting Lasers (VCSEL) units. The optical cavity of such vertical laser units is positioned vertically with respect to a substrate, between top and bottom reflector layers. This configuration provides optical emission extending in a direction exiting (generally perpendicular to) the surface defined by the substrate on which the VCSEL units are positioned. In the description below, such lasing units arranged in a plane and emitting radiation substantially perpendicular to said plane are exemplified as VCSEL units. Differently than previously known topological laser system, the present technique utilizes lasing units arranged in an array on a substrate and provide optical emission in a direction substantially perpendicular to the plane of the array. Thus, the present technique eliminates, or at least significantly reduces the passage of high-intensity emission through optical fibers or waveguides, e.g. forming laser resonators with a butt coupled output coupler. This reduces nonlinear effects associated with high-intensity light passing through matter, and enables stable, coherent and high-power emission.

Reference is made to FIG. 1 illustrating a laser source 100 formed of a plurality of light emitting units, generally at 50, arranged in a plane 60 (on a planar substrate) and configured to emit radiation substantially perpendicular to the substrate plane, e.g. configured as vertical cavity type units. The vertically light emitting units 50 are positioned/arranged on the substrate 60 in a selected array geometry and are coupled between them. Typically, the light emitting units 50 in said plurality of the light emitting units are arranged with physical coupling between neighboring lasing units 50 (e.g. with certain partial overlap of the structures of neighboring light emitting units 50). The arrangement of the light emitting units 50 defines a light emitting surface LE (plane of the light emitting units 50) such that the laser source system 100 is configured to emit output light OL in a direction generally/ substantially perpendicular to the light emitting surface LE (the plane defined by the light emitting units 50), thereby eliminating, or at least significantly reducing nonlinear interactions of the emitted light with material such as output couplers or optical fibers which are used in the known in-plane laser array systems.

It should be noted, although not specifically shown in FIG. 1, the lasing units 50 are arranged in a plurality (array) of unit cells each including a selected number (generally, at least two) of physically coupled lasing units. The lasing units of the unit cell may be different (have different bands), defining a topological structure of the unit cells' arrangement with proper optical coupling of adjacent lasing units 50 arranged in a region $R_1$ interfacing with a different type region/media $R_2$ (e.g. air). For example, a part (sub-array) of the lasing units 50 located in region $R_1$ and extending along an edge portion of region $R_1$ is exposed to (interfaces with) air in second region $R_2$; or as will be exemplified further below the second-media region may be constituted by a different sub-array of lasing units. This results in formation of a topological edge/state within at least a part of the interface between these regions. The interface region TP of the topological state is at times referred to herein below as a topological path.

In this example, the light emitting units 50 are VCSEL units. The VCSEL units 50 are typically formed as pillars extending from (grown of) the substrate 60. The example illustrated in FIG. 1A shows the VCSEL units formed of initial substrate pillar 58 (may be n-type semiconductor), bottom reflector 56, gain layer 54 (typically formed of quantum well or quantum dot layers) and top reflector 52.

The VCSEL units 50 are configured to be exposed to pumping energy PE. For example, in some configuration the VCSEL units 50 include electric connectors (not specifically shown) providing electric pumping energy PE.

Typically, to provide optical emission of the topological state, the pumping energy PE may be directed to at least a portion of the topological path. This pumping energy excites emission from lasing units 50 along one or more topological paths in the array 10. The coupling between the lasing units 50 provides spatial and temporal coherence of the light emitted from the lasing units 50 along the one or more topological paths.

Figure 1B:
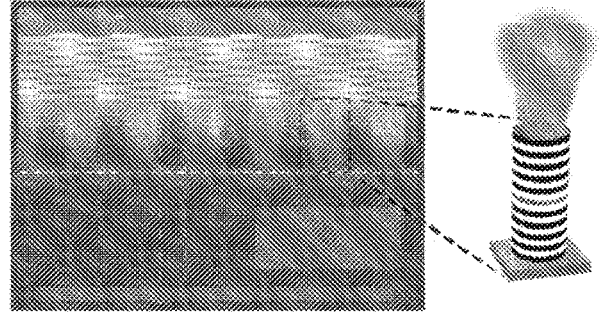
FIG. 1B shows more specifically the configuration of the VCSELs suitable to be used in the laser source of the present invention.

FIG. 1B shows more specifically the array of neighboring coupled VCSELs and operation of the individual VCSEL. The configuration scheme and operation of VCSELs separately are generally known and do not form part of the present invention and therefore need not be specifically described.

The neighboring VCSELs are partially physically coupled to one another, or even partially physically overlapping. To provide such physical coupling between the VCSEL units, they may be configured to enable touch of their outer surfaces or form partial overlap along a portion of the unit surfaces (e.g., circumference thereof). Typically, at least the gain layer of the VCSEL units, and possibly the top and bottom reflecting layers touch those of neighboring VCSEL units.

The configuration of the lasing units and their coupling may give rise to collective lasing modes with a photonic band structure. This band structure includes one or more photonic states in a gap between the bands of the photonic states. This facilitates optical coupling between the adjacent lasing units along the interface (topological path). The one or more photonic states in the topological gap correspond with at least one topological state within the array, which is typical to topological insulators.

In some configurations, the laser source system 100 may also include a spatial phase mask 70 positioned in the light emitted path from the different VCSEL units 50. The spatial phase mask 70 is configured to correct phase variations along the topological path to provide desired (generally flat) phase of the output light OL. As indicated above, the coherence along the one or more topological paths is typically predetermined and may be known but need not emit specifically with a flat phase of the light emission. To this end the spatial phase mask 70 may be used to correct for phase variations along the topological path.

The VCSEL units may be associated with two or more lasing modes having two or more different lasing frequencies; wherein the at least one topological state is associated with a selected lasing mode being induced by the coupling between the VCSEL units. The selected lasing mode may be of lower or higher energy with respect to the lasing modes of the VCSEL units. For example, each VCSEL unit may have itself several lasing modes with different lasing frequencies. However, mainly only in the lower mode (lower lasing frequency) the coupling between neighboring VCSEL units creates the topological mode. Every inter-mode comprised of higher VCSEL intra-modes would not exist solely on the edge and, therefore, due to weak overlap with the pump, would not lase.

Figure 2:
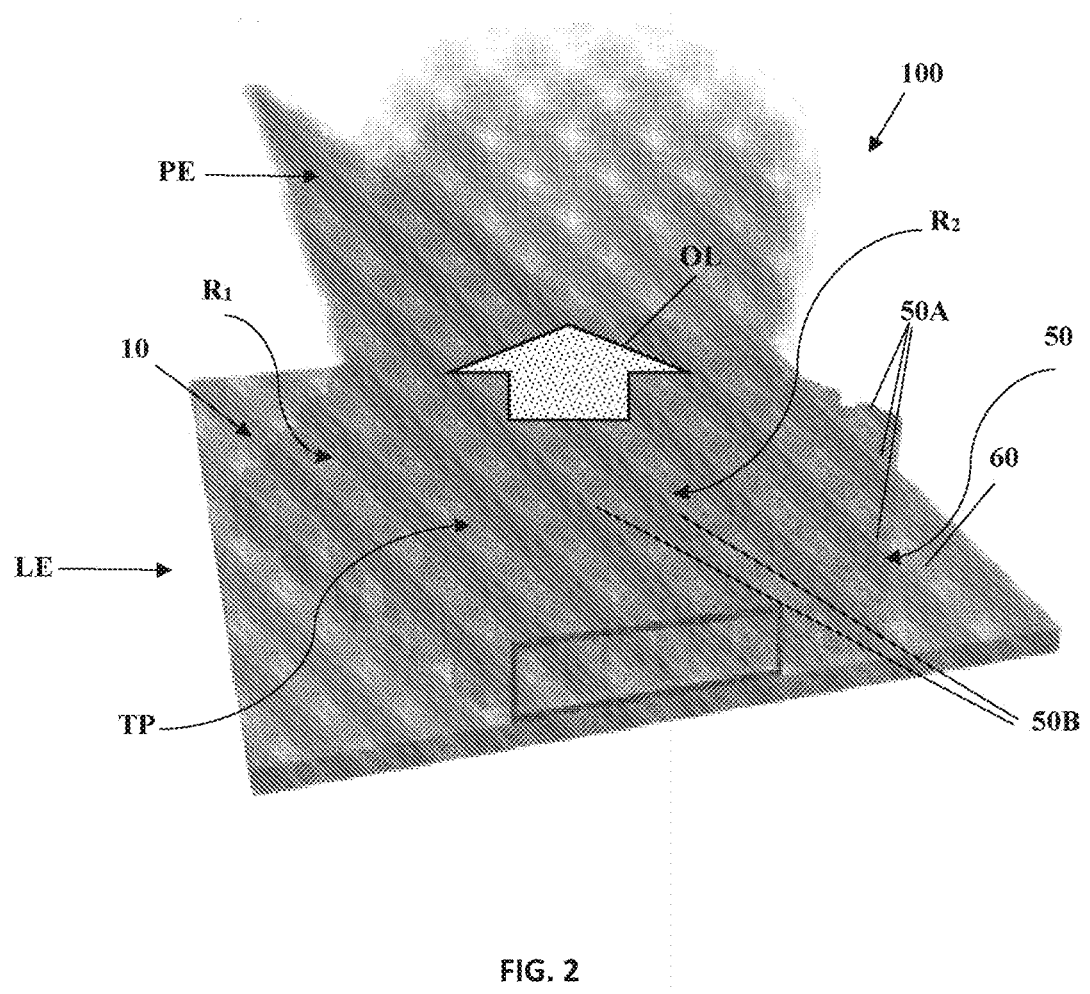
FIG. 2 schematically illustrates the configuration and operation of a laser source of the present invention according to some embodiments of the invention utilizing a plurality of vertically emitting lasing units arranged in first and second different sub-arrays forming a topological state at the interface region between them.

Reference is now made to FIG. 2 exemplifying a lasing system 100 according to some other embodiments of the invention. To facilitate understanding, the reference numbers are used to indicate the functionally similar components in all the examples of the invention.

According to these embodiments of the present invention, the plurality of the lasing units 50 are arranged in a plurality of units cells (each formed by a selected number of physically coupled lasing units) including at least two sub-arrays 50A and 50B of the unit cells of different types (configurations) arranged in at least two adjacent regions $R_1$ and $R_2$ defining an arrangement of adjacent lasing units along an interface region TP between them, forming at least one topological state along a topological path within the interface. In some embodiments, an interface region defines a closed path, i.e., one of these regions surrounds the other region. The interface region TP of the topological state is at times referred to herein below as a topological path.

The sub-arrays 50A and 50B include at least first and second types of unit cells having selected different internal geometry of the light emitting units forming the unit cell. The unit cells of the first and second types have generally similar unit cell parameters relating to lattice vectors of the array, in which the arrangements of the light emitting units in the unit cells are slightly different. Unit cells of the first and second types are arranged in first and second regions of the array, such that a first region is formed of unit cells of the first type, and a second region is formed of unit cells of the second type. Such configuration of the array supports topological states extending along the interface between the first and second regions of the array. In some preferred configurations, an interface between the first and second regions of the array forms a closed path surrounding at least one region (being first or second region) of the array.

The interface region between the first and second types sub-arrays may be of any shape, i.e. straight line, curve (zigzagged line), closed path (e.g. closed hexagon curve), and therefore the topological state has the corresponding configuration.

The VCSELs of the unit cell are partially physically coupled to one another, or even partially physically overlapping. To provide such physical coupling between the VCSEL units, they may be configured to enable touch of their outer surfaces or form partial overlap along a portion of the unit surfaces (e.g., circumference thereof). Typically, at least the gain layer of the VCSEL units, and possibly the top and bottom reflecting layers touch those of neighboring VCSEL units.

The configuration of the lasing units and their coupling may give rise to collective lasing modes with a photonic band structure. This band structure includes one or more photonic states in a gap between the bands of the photonic states. This facilitates optical coupling between the adjacent lasing units along the interface (topological path). The one or more photonic states in the topological gap correspond with at least one topological state within the array, which is typical to topological insulators.

It should be noted, although not specifically shown, that similar to the example of FIG. 1A, the laser source system 100 of FIG. 2 may also include a spatial phase mask positioned in the light emitted path from the different VCSEL units 50. The spatial phase mask is configured to correct phase variations along the topological path to provide desired (generally flat) phase of the output light. The spatial phase mask may be used to correct for phase variations along the topological path.

As indicated above, the unit cells may be arranged a periodic array. Considering the first and second sub-arrays of the lasing units in the first and second adjacent interfacing regions, the unit cells of the first and second sub-array are configured differently to define the topological state formed by adjacent optically coupled lasing units along an interface region between the first and second regions.

Figure 3:
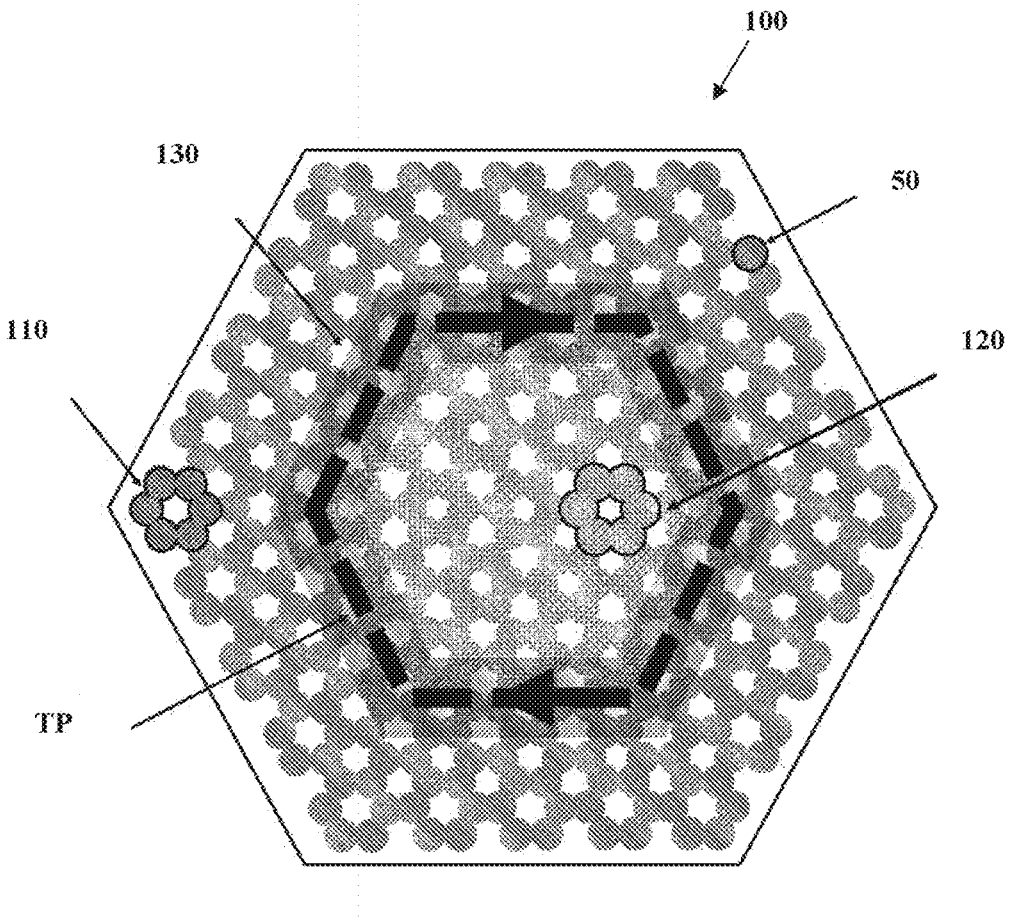
FIG. 3 exemplifies a laser source array according to some embodiments of the present invention utilizing a plurality of unit cells arranged in first and second different sub-arrays.

Reference is made to FIG. 3 exemplifying a specific non-limiting example of the configuration of a laser system 100 according to some embodiments of the invention. In this configuration, the VCSEL's 50 are arranged in hexagon shaped sextets (where VCSEL units are arranged in a honeycomb configuration). The array is formed as a generally triangular array having hexagon shaped unit cells of first 110 and second 120 types. The first and second types of unit cells have generally similar dimensions, while being different between them in the internal arrangement of the VCSEL units 50. As shown in FIG. 3, unit cells 120 of sub-array 50B are formed from VCSEL units 50 larger than those forming unit cells 110 of sub-array of 50A and having larger overlap along circumference of the VCSEL units 50. This configuration of the array generated a topological mode TP along path defined by interface of regions of unit cells of the first type 110 and regions of unit cells of the second type 120. The laser system 100 includes (is associated with) a pumping arrangement, e.g. electrical electrodes in contact with at least some of the VCSEL units 50. Typically, the pumping arrangement is configured to provide pumping energy along regions 130 (shaded in FIG. 3) substantially including at least part of the topological mode TP.

The exemplary configuration of FIG. 3 includes 366 VCSEL pillars (see "VCSEL pillar") arranged in hexagon shaped sextets of VCSEL units 50. These hexagons are arranged in two types of ordering in a triangular lattice. In the first type 110, the outer arrangement (darker gray), consists of hexagons with side length $a_1$ larger than a third ($\frac{1}{3}$) of the lattice constant of the triangular lattice a ($a_1 > a/3$). In the second type of unit cells 120, the inner arrangement (lighter gray), consists of hexagons with side length $a_2$ smaller than a third ($\frac{1}{3}$) of the constant $a (a_2 < a/3)$. The photonic eigenmodes in this system are spread over the whole array. However, due to the specific arraignment of the VCSEL pillars, the modes that exist on the interface between the two types of the arrangements (including corners) are the topological modes TP (marked with the black arrow). The continuity of these modes (overcoming defects, e.g. corners) promises a flux of light which locks all of these VCSEL units 50 together. When subjected to pumping energy along the area 130 of the topological edge modes, these modes lase and provide a vertical coherent beam which is robust to imperfections in the array. It should be noted and is indicated above that the pumping energy can be provided as electrical pumping and/or optical pumping in accordance with specific arrangement of the VCSEL units 50.

According to some embodiments, the 6 optical eigenmodes in a hexagon shaped unit cell comprising of 6 VCSELs can be divided into monopole, dipole, quadrupole and hexapole modes. Accordingly, the modes in the system during lasing can be divided in the same way.

According to some embodiments, at the interface between at least the first and second sub-array types, dipole (quadrupole) modes of one type match to dipole (quadrupole) modes in the second type. However, these are located at different edges of the bandgap, e.g., one dipole at the top of the gap for the first type and the other dipole in the bottom of the gap in the second type. Therefore, in the interface between the first and second sub-array types, there exists at least one edge mode in the center of the band gap which relates to these two dipole modes. The modes in the upper band of one sub-array are very similar to modes in the lower band of the second sub-array, and when in close vicinity, "couple" to form a topological mode in the gap.

Fabrication and manufacturing of a laser system according to the present technique may be based on standard pillar VCSEL fabrication. According to the present technique, the VCSEL units are formed/carved/fabricated in an array structure. The coupling between the VCSEL units is achieved by partially overlapping of neighboring VCSEL units, which is generally implemented already in the layout fabrication process. To attain topological properties the array is typically configured of at least two different types of array structures to support a photonic topological mode confined to the interface between the array types. In some embodiments, the array shape is a triangular lattice with the unit cells of a hexagonal shape, where the VCSEL units are located on the hexagon vertices. The difference between the two array types arises from different hexagon edge lengths. In this structure, a topologically protected mode exists on the interface between these two structures. When this exact mode is pumped, the VCSEL units that belong to this mode emit a coherent laser beam, even for a severe number of imperfections in the array.

Reference is made to FIGS. 4A to 4D and FIGS. 4A to 4D showing laser system and topological emission that results from the laser system. FIG. 4A illustrates structure of a laser system array including an arrangement of topological insulator VCSEL array. In this example, the array of VCSELs includes first and second sub-arrays of different first and second types of unit cell configurations. The first and second types of unit cells have oversized (stretched) hexagon and undersized (compressed) hexagon relatively to the other. As shown in the figure, the array includes Type 1 region of compressed lattice (honeycomb lattice) with $r_1 < a$, and a Type 2 region of stretched deformed lattice honeycomb with $r_2 > a$, where the size of a pillar-shaped VCSEL is d. The topological edge state region is optically pumped.

FIGS. 4B to 4D show hyperspectral imaging of, respectively, the photonic structure for the compressed bulk ($r_1$), the topological edge along interface between the array regions, and the photonic structure of the stretched bulk ($r_2$). As shown in FIGS. 4B and 4D, the bulk modes show photonic band gap where photonic modes are separated in different bands. FIG. 4C shows an edge mode located within the photonic bandgap, showing the existence of the topological mode. The topological photonic state exists at 1.3039 eV, within the bandgap of the bulk spectrum. The topological state is spatially located along the interface between the array regions. It can be seen that the topological gap of the stretched array type is aligned with the topological gap of the compressed array type, together forming a topological gap 553 µeV wide.

Figures 5A, 5B, 5C:
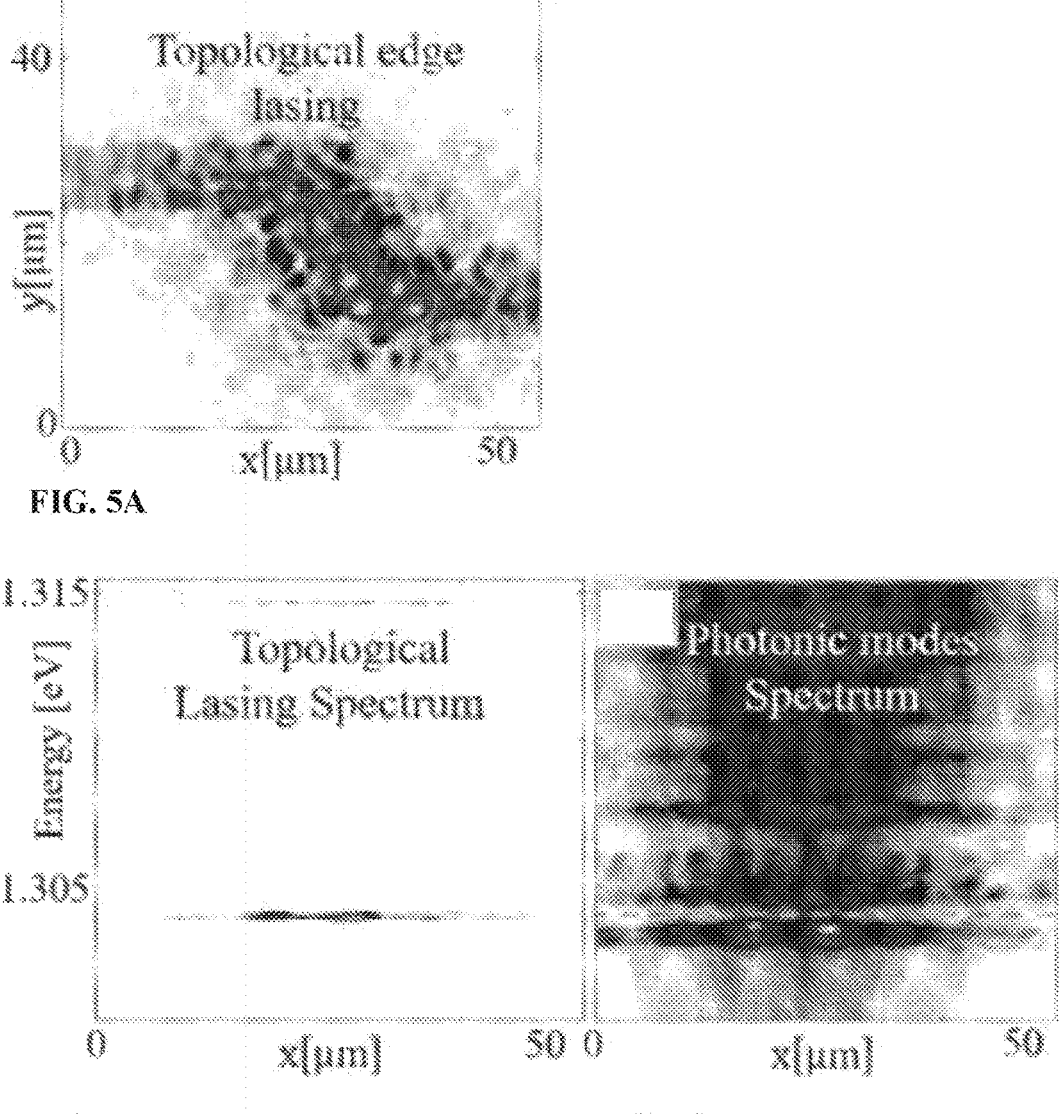

FIGS. 5A to 5D show spatial and spectral distribution of emission of the topological mode (FIGS. 5A and 5B) and the bulk array (FIGS. 5C and 5D). FIG. 5A shows near field emission pattern of a topological state formed in the array illustrated in FIG. 4A, as indicated to topological state is formed along the interface between the sub-array regions having different unit cell configurations. The variation may generally be associated with coupling of the VCSEL units forming the unit cell of the array. FIG. 5B shows lasing spectrum of the topological state under optical pumping. The pumping is directed to the spatial region of the topological state, i.e. directed at the interface between the different sub-array types. FIG. 5C shows the spectrum of the excited photonic modes of the bulk array measured using hyperspectral imaging. As shown, the spectrum of the topological state falls within the gap of the spectrum of the bulk modes. FIG. 5D shows near field pattern of lasing in a trivial bulk mode.

In order to initiate lasing of the topological edge state the interface between the two types of sub-array structures (characterized by the two types of the unit cells) can, for example, be non-resonantly pumped with a pulsed hexagon-shaped beam. Measurements of the lasing pattern and the spectrum are shown in FIGS. 6A to 6D which illustrate spectrum as a function of position at the topological interface.

FIG. 6A shows spectrum of the excited photonic states when pumping is below the lasing threshold by using hyperspectral imaging. In particular, the array does not emit light (lase) when pumped below the lasing threshold, and the spectrum shows multiple excited photonic states.

FIG. 6B shows lasing spectrum of the topological state under optical pumping above the lasing threshold. As can be seen, when the pumping is above the lasing threshold, a single-mode lasing exactly at the wavelength of the topological state is observed. The lasing topological state maintains a narrow emission spectrum at a stable energy of 1.301 eV with a 249 µeV linewidth, which is less than half the width of the topological bandgap of the system (553 µeV). Moreover, the lasing linewidth of a single individual VCSEL in the array of the system is ~170 µeV. This means that the 30-emitter VCSEL array lases with a linewidth almost as narrow as that of a single VCSEL unit in the array.

FIG. 6C shows the optical output of the system. As can be seen, lasing occurs precisely at the topological interface of the array. VCSEL (1) is located on a corner and VCSELs (2) and (3) are located at far apart regions of the array, with 3 corners on the light path between them. Nevertheless, the lasing is relatively uniform along the topological edge.

FIG. 6D shows the total lasing spectrum of the topological array. The output spectra of a single VCSEL when the array is pumped below and above the lasing threshold are represented by curve 71 and curve 72, respectively. The overall lasing spectrum of the topological state (curve 73) is narrow and located in the topological gap.

Figures 7A, 7B, 7C, 7D:
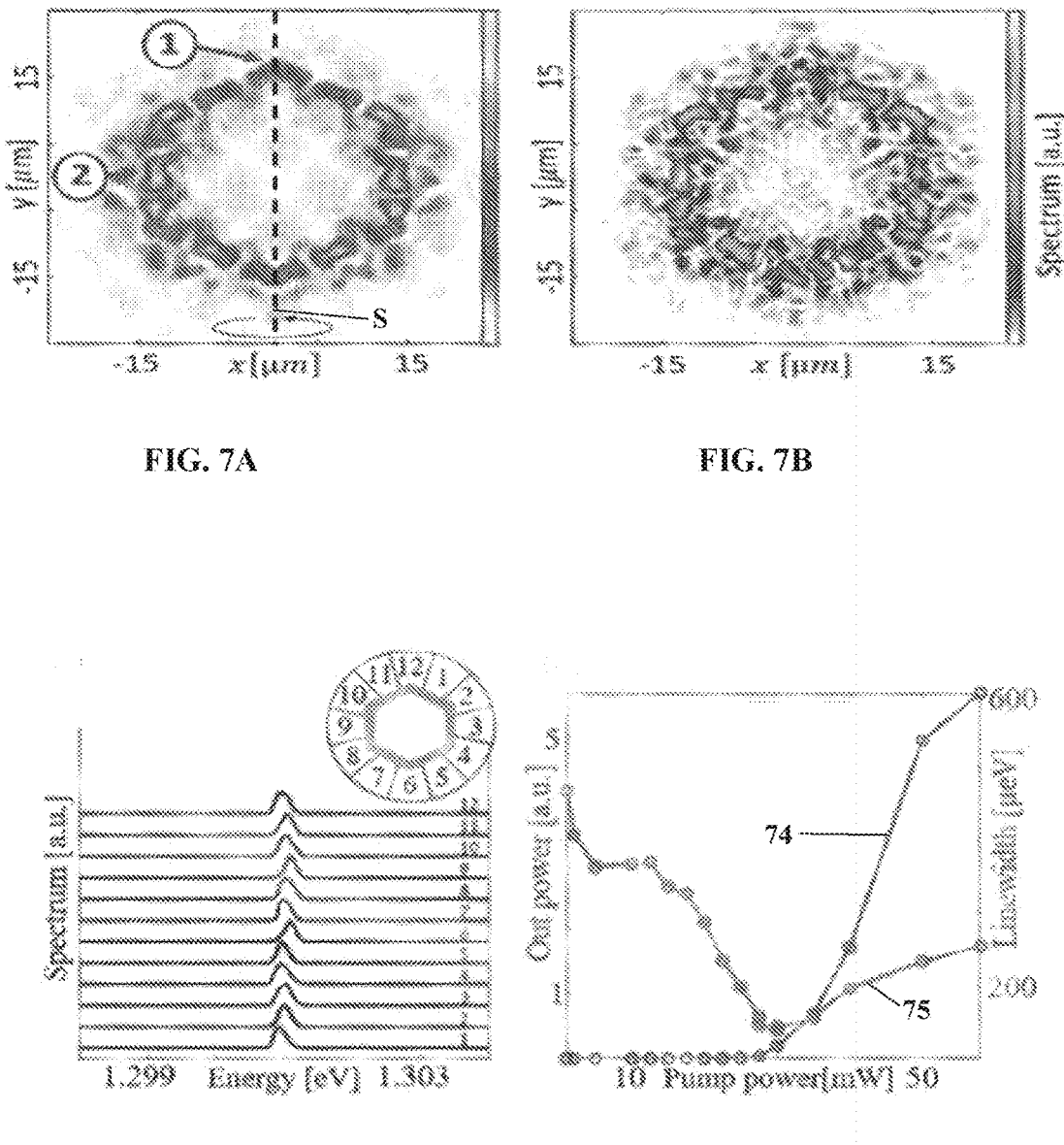
FIGS. 7A to 7D show interference properties between the VCSEL units in various positions in the VCSEL array.

An important ingredient of proving coherence, in particular with multi-emitter laser system such as the VCSELs array, is to show the interference between the VCSEL units located far apart from each other. FIG. 7A. to 7D show interference properties between the VCSEL units in various positions in the VCSEL array.

FIG. 7A shows interference between the lasing field and its mirror image around a symmetry axis S at x=0, measuring coherence between the VCSEL units located symmetrically with respect to the symmetry axis S around x=0. More specifically, interference fringes in point 1 measure the coherence of VCSEL unit (1) in FIG. 6C with itself (superimposed with itself), and fringes in point 2 show coherence between the two distinct VCSEL units (2) and (3) in FIG. 6C (VCSEL units (2) is superimposed with VCSEL units (3)) located 13 emitters apart from one another. As can be seen in FIG. 7A, all the VCSEL units display high visibility interference.

FIG. 7B shows coherent part of the lasing (after a band pass filter). As can be seen, all 30 VCSEL units of the topological edge state are mutually coherent. The VCSEL array exhibits coherence even for two lasers separated by three corners on a path between them, e.g., the interference contrast is similarly high for the point of auto-correlation (1) and the sites (2) and (3) which are the furthest apart. Thus, the VCSEL array exhibits high interference properties and acts as a single coherent laser source.

FIG. 7C shows lasing spectrum of spatially separated regions in the VCSEL array, one on top of the other for easier comparison. As shown in FIG. 7C, the spectrum of all the VCSEL units is very similar and is located within the spectral region of the topological band gap.

FIG. 7D shows light output power (curve 74) and the spectral width (curve 75) vs the input pump power. The curve shows lasing above threshold. The linewidth is significantly decreased at the threshold, linked to the build-up of coherence and one of the main characteristics of a laser.

Figure 8A:
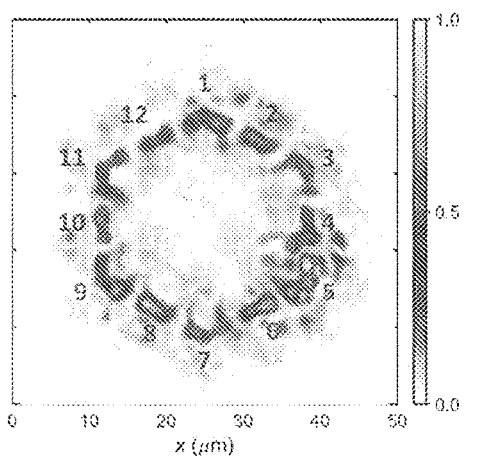
FIGS. 8A to 8C and FIGS. 9A to 9C show spatial and spectral distribution of emission of the topological mode of the VSCEL array at ambient temperatures of 4K and 200K, respectively.
Figure 8B:
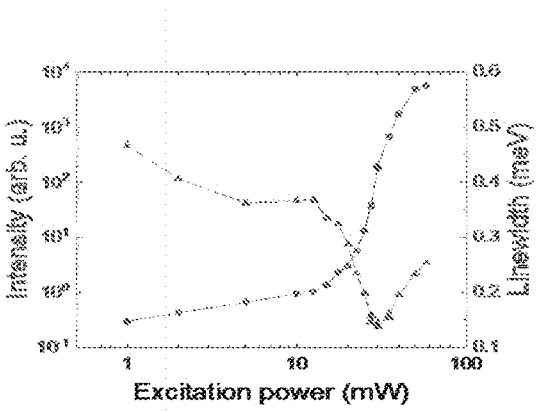
Figure 8C:
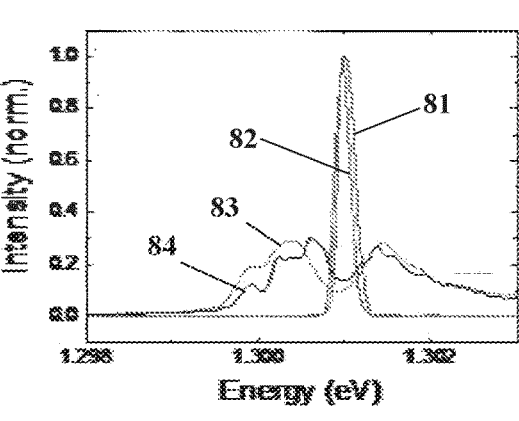
Figures 9A, 9B, 9C:
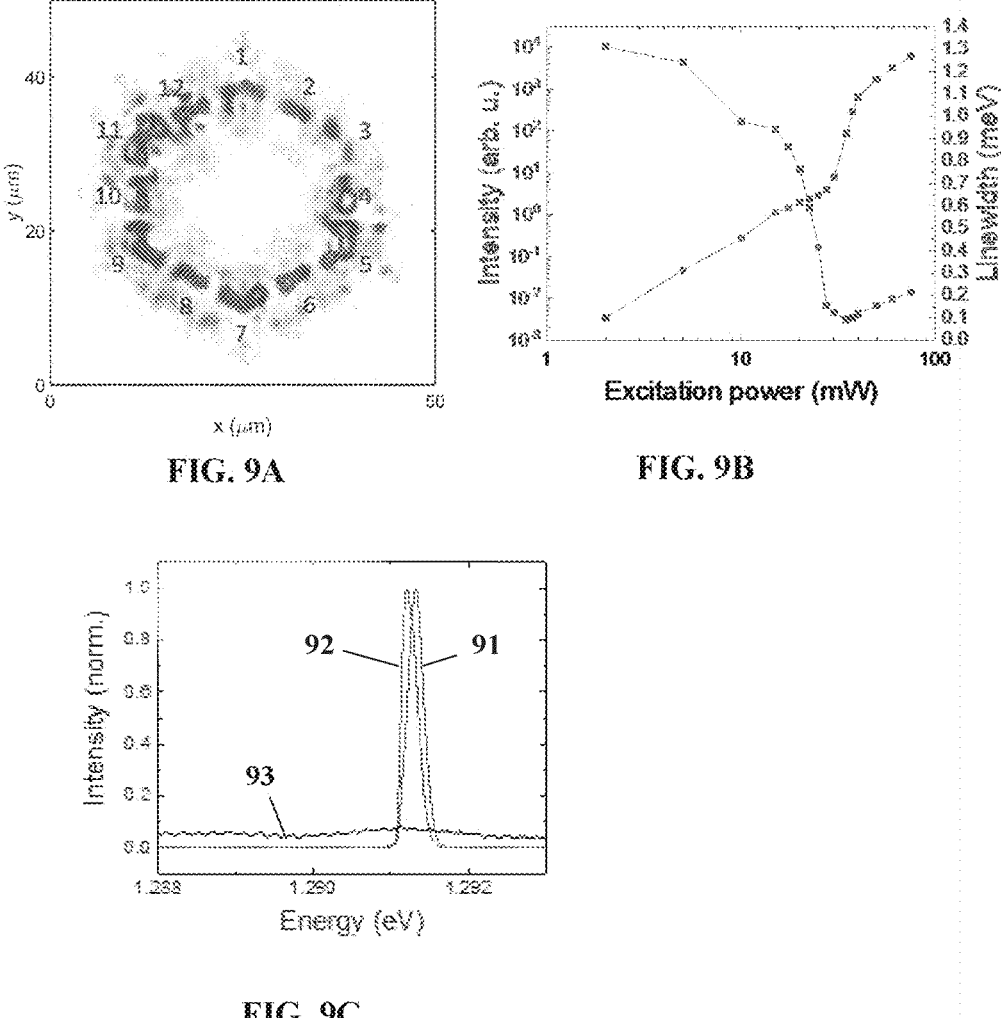

Reference is made to FIGS. 8A to 8C and FIGS. 9A to 9C show spatial and spectral distribution of emission of the topological mode of the VSCEL array at ambient temperatures of 4K and 200K, respectively. FIGS. 8A and 9A shows real space tomography images of the energy of the topological interface state at excitation power above the lasing threshold. FIGS. 8B and 9B show input-output characteristics of the VCSEL array as well as linewidth of the topological lasing state. FIGS. 8C and 9C illustrate spectral comparison of a single VCSEL unit below and above the lasing threshold as well as the integrated spectrum of the full interface of 30 VCSEL units. In particular, in FIG. 8C curves 81 and 82 represent total output spectra of the 30 VCSEL units and that of a single VCSEL unit, respectively, when the pumping is above the lasing threshold. Curves 83 and 84 represent total output spectra of the 30 VCSEL units and that of a single VCSEL unit, respectively, when the pumping is below the lasing threshold. In FIG. 9C curve 91 represents the total output spectra of the 30 VCSEL units when the pumping is above the lasing threshold. Curves 92 and 93 represent output spectra of a single VCSEL unit when the pumping is above and below the lasing threshold, respectively.

The inventors have shown that the system is robust to ambient temperature variations. In particular, the VCSEL array exhibits similar narrow linewidth lasing behavior in a wide range of ambient temperatures despite the fact that such large temperature variations always change the refractive index and therefore affect the lasing wavelength. In particular, it was shown that the linewidth of the topological VCSEL array remains narrow (~249 µeV) in a wide temperature range between 4 K and 200 K. This implies that the topological properties of VCSEL array are not sensitive to changes in the wavelength. This occurs since the topological VCSEL array scheme separates between the emission direction being substantially perpendicular to the plane of the array (where the DBRs and microcavity determine the operative wavelength) and the in-plane topological coupling, which in all other schemes of topological insulator lasers are strongly coupled.

These results illustrate optical emission of the topological mode providing stable, coherent, and robust emission from a collection of VCSEL units in various temperatures. Emission of the topological mode is spectrally located within a gap in the array emission spectrum, resulting in stable mode that is generally not affected by variations or defects in the array.

The present invention enables to provide a laser system having high-power output, while maintaining compact form (e.g. several millimeters). This is in comparison to standard gas lasers that can reach high output powers but are on the scale of centimeters due to their inevitable large cavity size. Further, as the optical emission is directed to exit the surface where the VCSEL units are arranged, there is only limited interaction of the emitted light with any material, eliminating or at least significantly reducing nonlinear interactions of the high-power output emission.

The invention claimed is:

1. A laser source comprising a plurality of lasing units arranged in unit cells placed within an emitting plane and configured to form a topological structure, wherein each of the unit cells includes a plurality of the lasing units configured as vertical cavity surface emitting lasers (VCSEL) capable of emitting radiation component substantially perpendicular to said emitting plane, the VCSELs of the unit cells comprising at least a first sub-array of the unit cells located in a first region interfacing with a second region of a different type than said first region, the VCSELs of the first sub-array being arranged such that most of energy is emitted outside the emitting plane and a portion of the energy flows in-plane, thereby defining an arrangement of the lasing units of the unit cells with in-plane coupling of the lasing units of the first sub-array along an interface region between the first and second adjacent regions, with in-plane coupling of the lasing units of the first sub-array provides at least one topological edge state of the unit cells with a topological protection supporting one or more topologically stable modes along a topological path within said interface region, providing collective emission forming a uniform coherent beam directed substantially perpendicular to the emitting plane.

2. The laser source according to claim 1, wherein the plurality of the lasing units comprises at least one periodic sub-array of the unit cells.

3. The laser source according to claim 1, wherein said interface region is exposed to air in said second region.

4. The laser source according to claim 2, wherein the unit cell comprises at least two lasing units of different configurations.

5. The laser source according to claim 1, wherein said plurality of the lasing units comprises at least one second sub-array of the unit cells configured differently from the first sub-array and located in said second region, the first and second sub-arrays being arranged in the first and second adjacent regions defining the arrangement of the optically coupled lasing units along the interface region between the first and second regions, forming the at least one topological state with the topological protection along the topological path within said interface.

6. The laser source according to claim 5, wherein the unit cells of the different adjacent sub-arrays are formed with different levels of physical coupling between the lasing units of the unit cell.

7. The laser source according to claim 1, wherein said lasing units are photonic crystal VCSELs.

8. The laser source according to claim 1, wherein said plurality of VCSEL units are formed as pillars extending from a planar surface of a substrate and at least partially overlapping between them thereby providing said partial physical coupling.

9. The laser source according to claim 1, wherein the lasing units of the unit cell are arranged in a honeycomb configuration.

10. The laser source according to claim 5, wherein the unit cells have a certain geometric shape, the unit cells of the different configurations having, respectively, stretched and compressed configurations of said geometric structure.

11. The laser source according to claim 1, wherein the topological path has at least one of following configurations: straight line, curve, closed loop path.

12. The laser source according to claim 1, further comprising a pumping unit configured to provide pumping energy to the lasing units located in at least a portion of said at least one topological path.

13. The laser source of claim 1, wherein the lasing units are associated with two or more lasing modes having two or more different lasing frequencies; said at least one topological state being associated with a selected lasing mode being strengthened by optical coupling between the lasing units of the topological path.

14. The laser source of claim 1, further comprising a phase mask positioned at output path of light emitted from at least some of the lasing units located in the topological path, said phase mask having phase pattern selected to provide a single coherent high intensity output beam.

15. A system comprising the laser source according to claim 1.

16. The laser source of claim 1, wherein the lasing units of the unit cell are partially physically coupled between them.

17. A laser source comprising a plurality of lasing units arranged within an emitting plane and configured to form a topological structure, wherein each of the lasing units is configured as a vertical cavity surface emitting laser (VCSEL) capable to emit radiation component substantially perpendicular to said emitting plane, the lasing units being arranged in a plurality of unit cells, each including a plurality of the lasing units optically coupled between them, said plurality of the unit cells comprising at least two sub-arrays of the lasing units of at least two different configurations, respectively, located in at least two adjacent regions, thereby defining an arrangement of adjacent lasing units along an interface region between said at least two adjacent regions, the VCSELs of each of said at least two sub-arrays of the lasing units being arranged such that most of energy is emitted outside the emitting plane and a portion of the energy flows in-plane, thereby defining an arrangement of the lasing units of the unit cells with in-plane coupling of the lasing units along said interface region forming at least one topological state with a topological protection along a topological path within said interface region, providing collective emission forming a uniform coherent beam directed substantially perpendicular to the emitting plane.

18. The laser source of claim 17, wherein the lasing units of the unit cell are partially physically coupled between them.

19. A laser source comprising a plurality of lasing units arranged in unit cells placed within a plane and configured to form a topological structure, wherein each of the unit cells includes a plurality of the lasing units optically coupled between them, each of the lasing units having a vertical optical cavity between top and bottom reflectors and being capable of emitting radiation component substantially perpendicular to said plane, said plurality of the unit cells comprising at least a first sub-array of the unit cells located in a first region interfacing with a second region of a different type than said first region, thereby defining an arrangement of optically coupled lasing units of the unit cells along an interface region between the first and second adjacent regions, forming at least one topological state of the unit cells along a topological path within said interface region, wherein the lasing units are associated with two or more lasing modes having two or more different lasing frequencies; said at least one topological state being associated with a selected lasing mode being strengthened by optical coupling between the lasing units of the topological path.

20. A laser source comprising:

a plurality of lasing units arranged in unit cells placed within a plane and configured to form a topological structure, wherein each of the unit cells includes a plurality of the lasing units optically coupled between them, each of the lasing units having a vertical optical cavity between top and bottom reflectors and being capable of emitting radiation component substantially perpendicular to said plane, said plurality of the unit cells comprising at least a first sub-array of the unit cells located in a first region interfacing with a second region of a different type than said first region, thereby defining an arrangement of optically coupled lasing units of the unit cells along an interface region between the first and second adjacent regions, forming at least one topological state of the unit cells along a topological path within said interface region; and a phase mask positioned at output path of light emitted from at least some of the lasing units located in the topological path, said phase mask having phase pattern selected to provide a single coherent high intensity output beam.

* * * * *